United States Patent
Bleeker et al.

(10) Patent No.: US 7,403,266 B2
(45) Date of Patent: Jul. 22, 2008

(54) MASKLESS LITHOGRAPHY SYSTEMS AND METHODS UTILIZING SPATIAL LIGHT MODULATOR ARRAYS

(75) Inventors: Arno Bleeker, Westerhoven (NL); Wenceslao A. Cebuhar, Norwalk, CT (US); Jason Douglas Hintersteiner, Norwalk, CT (US); Andrew W. McCullough, Newtown, CT (US); Solomon S. Wasserman, Long Beach, NY (US); Karel Diederick Van Der Mast, Helmond (NL)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/331,064

(22) Filed: Jan. 13, 2006

(65) Prior Publication Data

US 2006/0114438 A1 Jun. 1, 2006

Related U.S. Application Data

(60) Continuation-in-part of application No. 11/192,188, filed on Jul. 29, 2005, now Pat. No. 7,046,413, which is a continuation of application No. 10/447,214, filed on May 29, 2003, now Pat. No. 6,989,920, said application No. 11/331,064 is a continuation of application No. 10/950,644, filed on Sep. 28, 2004, now abandoned, which is a division of application No. 10/449,908, filed on May 30, 2003, now Pat. No. 7,061,591.

(51) Int. Cl.
*G03B 27/54* (2006.01)
*G03B 27/72* (2006.01)

(52) U.S. Cl. .......................................... 355/67; 355/69

(58) Field of Classification Search ................. 355/53, 355/67–71; 430/5, 20, 30; 359/237, 224, 359/291, 2
See application file for complete search history.

(56) References Cited

U.S. PATENT DOCUMENTS 4,786,149 A 11/1988 Hoenig et al.

(Continued)

FOREIGN PATENT DOCUMENTS

EP 1 280 007 A2 1/2003

(Continued)

OTHER PUBLICATIONS

Singapore Search Report Application No. 200402972-4 mailed by Intellectual Property Office of Singapore Mar. 15, 2005, 8 pages.

(Continued)

*Primary Examiner*—Henry Hung Nguyen
(74) *Attorney, Agent, or Firm*—Sterne, Kessler, Goldstein & Fox PLLC

(57) ABSTRACT

A maskless lithography system that writes patterns on an object. The system can include an illumination system, the object, spatial light modulators (SLMs), and a controller. The SLMs can pattern light from the illumination system before the object receives the light. The SLMs can include a leading set and a trailing set of the SLMs. The SLMs in the leading and trailing sets change based on a scanning direction of the object. The controller can transmit control signals to the SLMs based on at least one of light pulse period information, physical layout information about the SLMs, and scanning speed of the object. The system can also correct for dose non-uniformity using various methods.

36 Claims, 15 Drawing Sheets

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,661,712 A | 8/1997 | Chiba | |
| 5,677,703 A | 10/1997 | Bhuva et al. | |
| 5,691,541 A | 11/1997 | Ceglio et al. | |
| 5,738,165 A * | 4/1998 | Imai | 165/80.2 |
| 5,745,281 A | 4/1998 | Yi et al. | |
| 5,808,797 A | 9/1998 | Bloom et al. | |
| 5,870,176 A | 2/1999 | Sweatt et al. | |
| 5,982,553 A | 11/1999 | Bloom et al. | |
| 5,995,688 A | 11/1999 | Askyuk et al. | |
| 6,060,224 A | 5/2000 | Sweatt et al. | |
| 6,124,064 A | 9/2000 | Ozawa | |
| 6,133,986 A | 10/2000 | Johnson | |
| 6,163,643 A | 12/2000 | Bergmann et al. | |
| 6,173,105 B1 | 1/2001 | Askyuk et al. | |
| 6,177,980 B1 | 1/2001 | Johnson | |
| 6,275,320 B1 | 8/2001 | Dhuler et al. | |
| 6,285,488 B1 * | 9/2001 | Sandstrom | 359/290 |
| 6,312,134 B1 | 11/2001 | Jain et al. | |
| 6,373,619 B1 | 4/2002 | Sandstrom | |
| 6,375,903 B1 | 4/2002 | Cerrina et al. | |
| 6,473,237 B2 | 10/2002 | Mei | |
| 6,498,685 B1 | 12/2002 | Johnson | |
| 6,501,535 B1 | 12/2002 | Ozawa | |
| 6,552,855 B1 | 4/2003 | Kowarz et al. | |
| 6,567,163 B1 | 5/2003 | Sandstrom | |
| 6,573,977 B1 | 6/2003 | Mori | |
| 6,606,739 B2 | 8/2003 | Kanatake et al. | |
| 6,687,041 B1 | 2/2004 | Sandstrom | |
| 6,707,534 B2 | 3/2004 | Bjorklund et al. | |
| 6,730,925 B1 | 5/2004 | Ozawa | |
| 6,747,783 B1 | 6/2004 | Sandstrom | |
| 6,778,257 B2 | 8/2004 | Bleeker et al. | |
| 6,795,169 B2 | 9/2004 | Tanaka et al. | |
| 6,806,897 B2 | 10/2004 | Kataoka et al. | |
| 6,806,954 B2 | 10/2004 | Sandstrom | |
| 6,809,954 B1 | 10/2004 | Madan et al. | |
| 6,811,953 B2 | 11/2004 | Hatada et al. | |
| 6,870,554 B2 | 3/2005 | Jain | |
| 6,989,920 B2 | 1/2006 | Hintersteiner et al. | |
| 7,046,413 B2 | 5/2006 | Hintersteiner et al. | |
| 7,061,591 B2 | 6/2006 | Bleeker et al. | |
| 2003/0001798 A1 | 1/2003 | Okuyama | |
| 2004/0041104 A1 | 3/2004 | Liebregts et al. | |
| 2004/0130561 A1 | 7/2004 | Jain | |
| 2004/0239907 A1 * | 12/2004 | Hintersteiner et al. | 355/67 |
| 2004/0239908 A1 | 12/2004 | Bleeker et al. | |
| 2005/0007572 A1 | 1/2005 | George et al. | |
| 2005/0046819 A1 | 3/2005 | Bleeker et al. | |
| 2005/0270613 A1 | 12/2005 | Hintersteiner et al. | |

FOREIGN PATENT DOCUMENTS

| | | |
|---|---|---|
| EP | 1 482 375 A2 | 12/2004 |
| JP | 8-274399 A | 10/1996 |
| JP | 10-229038 A | 8/1998 |
| JP | 2000-3514 A | 1/2000 |
| JP | 2002-506230 A | 2/2002 |
| JP | 2002-372790 A | 12/2002 |
| JP | 2003-015309 A | 1/2003 |
| WO | WO 97/37283 A1 | 10/1997 |
| WO | WO98/04950 | 2/1998 |
| WO | WO 98/04950 A1 | 2/1998 |
| WO | WO98/33096 | 7/1998 |
| WO | WO98/38597 | 9/1998 |
| WO | WO99/45435 | 9/1999 |
| WO | WO 99/45436 A1 | 9/1999 |
| WO | WO 02/12961 A1 | 2/2002 |

OTHER PUBLICATIONS

English translation of Search Report, dated Apr. 13, 2007, for JP Patent Application No. 2004-162318, 2 pgs.

Search Report for EP Application No. 04011778.0-1226, mailed Sep. 12, 2007, 3 pgs.

Written Opinion for Singapore Patent Application No.: 200402972-4, date received May 28, 2007, 3 pgs.

Office Action for Japanese Patent Application No.: 2004-162317, drafted on Jun. 7, 2007, 6 pgs.

Translation of Office Action for Chinese Application No. 200410047667.3 drafted Dec. 21, 2007, 12 pgs.

Supplementary Search Report for Singapore Application No. 200402972-4 mailed Feb. 1, 2008, 6 pgs.

Japanese Office Action and Translation of Office Action for Patent Application No. 2004-162318 mailed May 13, 2008, 4 pgs.

* cited by examiner

MASKLESS LITHOGRAPHY SYSTEMS AND METHODS UTILIZING SPATIAL LIGHT MODULATOR ARRAYS

CROSS REFERENCE TO RELATED APPLICATIONS

This application is a continuation of U.S. Ser. No. 10/950,644, filed Sep. 28, 2004 (now abandoned), which is a divisional application of U.S. application Ser. No. 10/449,908, filed May 30, 2003 (now U.S. Pat. No. 7,061,591 that issued Jun. 13, 2006), which are incorporated by reference herein in their entireties.

This application is also continuation-in-part of U.S. application Ser. No. 11/192,188, filed Jul. 29, 2005 (now U.S. Pat. No. 7,046,413 that issued May 16, 2006), which is a continuation of U.S. application Ser. No. 10/447,214, filed May 29, 2003 (now U.S. Pat. No. 6,989,920 that issued Jan. 24, 2006), which are incorporated by reference herein in their entireties.

BACKGROUND

1. Field of the Invention

The present invention relates generally to lithography. More particularly, the present invention relates to maskless lithography.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer.

These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is accomplished by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized.

Conventional lithographic systems and methods form images on a semiconductor wafer. The system typically has a lithographic chamber that is designed to contain an apparatus that performs the process of image formation on the semiconductor wafer. The chamber can be designed to have different gas mixtures and grades of vacuum depending on the wavelength of light being used. A reticle is positioned inside the chamber. A beam of light is passed from an illumination source (located outside the system) through an optical system, an image outline on the reticle, and a second optical system before interacting with a semiconductor wafer.

A plurality of reticles are required to fabricate a device on the substrate. These reticles are becoming increasingly costly and time consuming to manufacture due to the feature sizes and the exacting tolerances required for small feature sizes. Also, a reticle can only be used for a certain period of time before being worn out. Further costs are routinely incurred if a reticle is not within a certain tolerance or when the reticle is damaged. Thus, the manufacture of wafers using reticles is becoming increasingly, and possibly prohibitively expensive.

In order to overcome these drawbacks, maskless (e.g., direct write, digital, etc.) lithography systems have been developed. The maskless system replaces a reticle with a spatial light modulator (SLM) (e.g., a digital micromirror device (DMD), a liquid crystal display (LCD), or the like). The SLM includes an array of active areas (e.g., mirrors or transmissive areas) that are either ON or OFF to form a desired pattern. A predetermined and previously stored algorithm based on a desired exposure pattern is used to turn ON and OFF the active areas.

Conventional SLM-based writing systems (e.g., Micronic's Sigma 7000 series tools) use one SLM as the pattern generator. To achieve linewidth and line placement specifications, gray scaling is used. For analog SLMs, gray scaling is achieved by controlling mirror tilt angle (e.g., Micronic SLM) or polarization angle (e.g., LCD). For digital SLMs (e.g., TI DMD), gray scaling is achieved by numerous passes or pulses, where for each pass or pulse the pixel can be switched either ON or OFF depending on the level of gray desired. Because of the total area on the substrate to be printed, the spacing between active areas, the timing of light pulses, and the movement of the substrate, several passes of the substrate are required to expose all desired areas. This results in low throughput (number of pixels packed into an individual optical field/number of repeat passes required over the substrate) and increased time to fabricate devices. Furthermore, using only one SLM requires more pulses of light or more exposure time to increase gray scale. This can lead to unacceptably low levels of throughput.

Therefore, what is needed is a maskless lithography system and method that can expose all desired areas on a substrate for each pattern during only one pass of a substrate.

SUMMARY

The present invention provides a maskless lithography system. The system can include an illumination system, an object, spatial light modulators (SLMs), and a controller. The SLMs can pattern light from the illumination system before the object receives the light. The SLMs can include a leading set and a trailing set of the SLMs. The SLMs in the leading and trailing sets change based on a scanning direction of the object. The controller can generate control signals to the SLMs based on at least one of light pulse period information, physical layout information about the SLMs, and scanning speed of the object.

Other embodiments of the present invention provide a method for controlling dose in maskless lithography. The method includes measuring a dose delivered in each pulse in a series of pulses from SLMs, calculating a dose error based on the measuring steps, calculating a correctional blanket dose based on the dose error, and applying the correctional blanket dose using a final set of SLMs.

Still other embodiments of the present invention include a method for controlling dose in maskless lithography. The method includes measuring an intensity of a dose from a leading set of SLMs, subtracting the measured intensity from a predetermined value to generate an error signal, delaying the error signal, adding the delayed signal another predetermined value to generate a control signal, and using the control signal to control dose from a trailing set of SLMs.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 5, 6, 7, 8, 9, and 10 show two-dimensional arrays of spatial light modulators according to various embodiments of the present invention.

Figure 11:
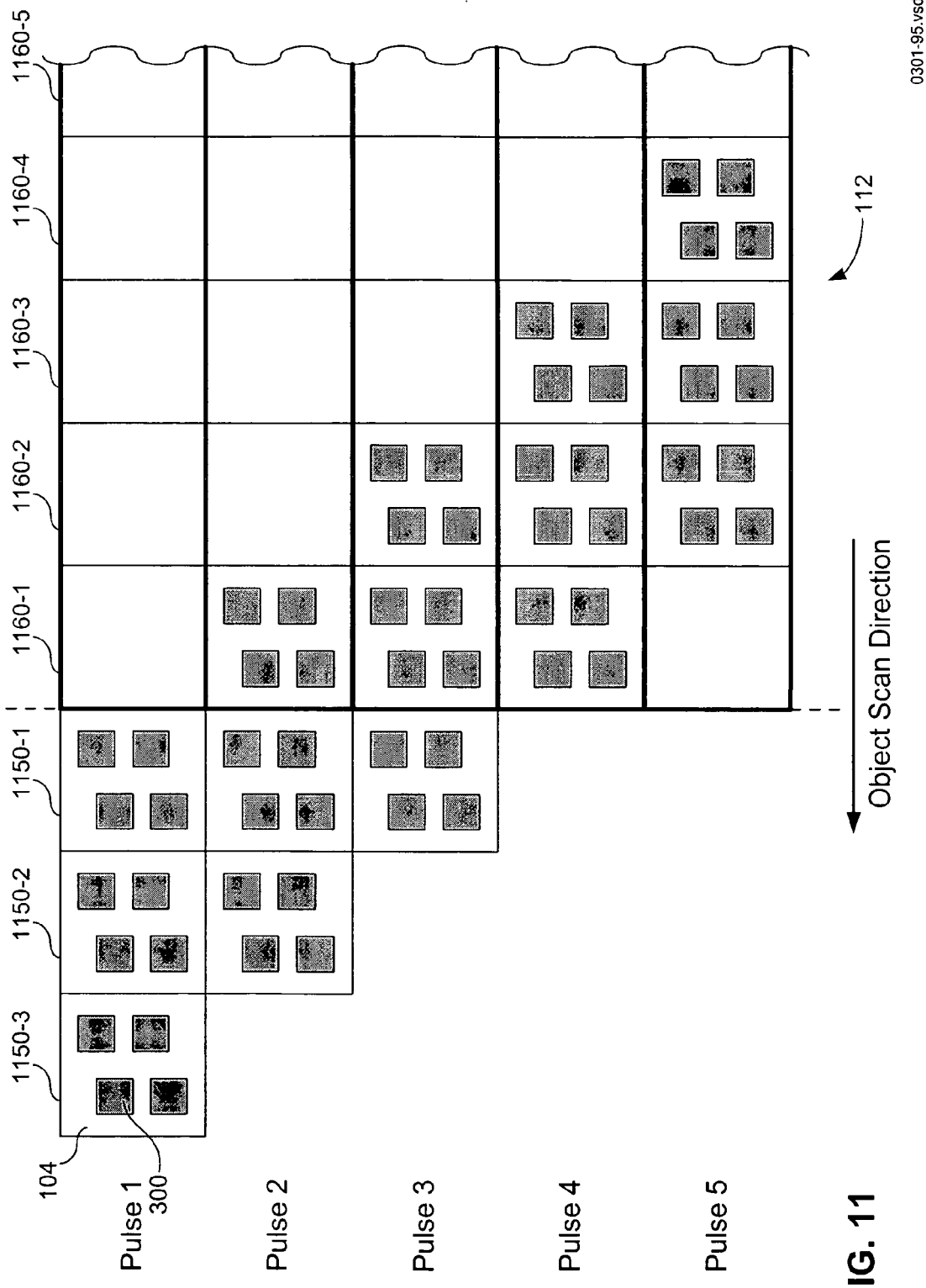

FIG. 11 shows an exposure diagram for sequential pulses of light from an illumination source according to various embodiments of the present invention.

Figure 12:
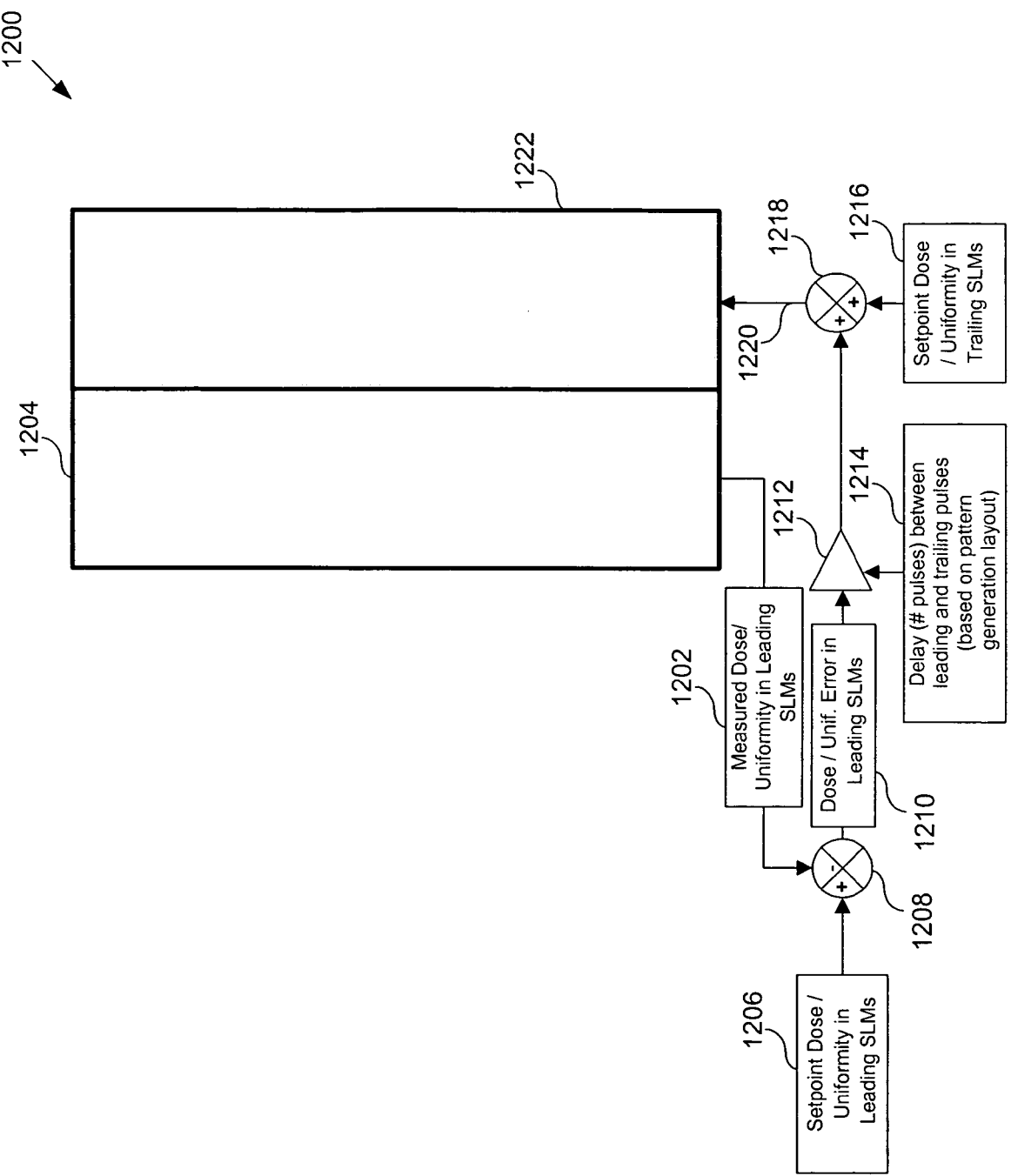

FIG. 12 is a system 1200 that can control dose and/or uniformity for a multiple SLM pattern generation array, according to an embodiment of the present invention.

Figure 13:
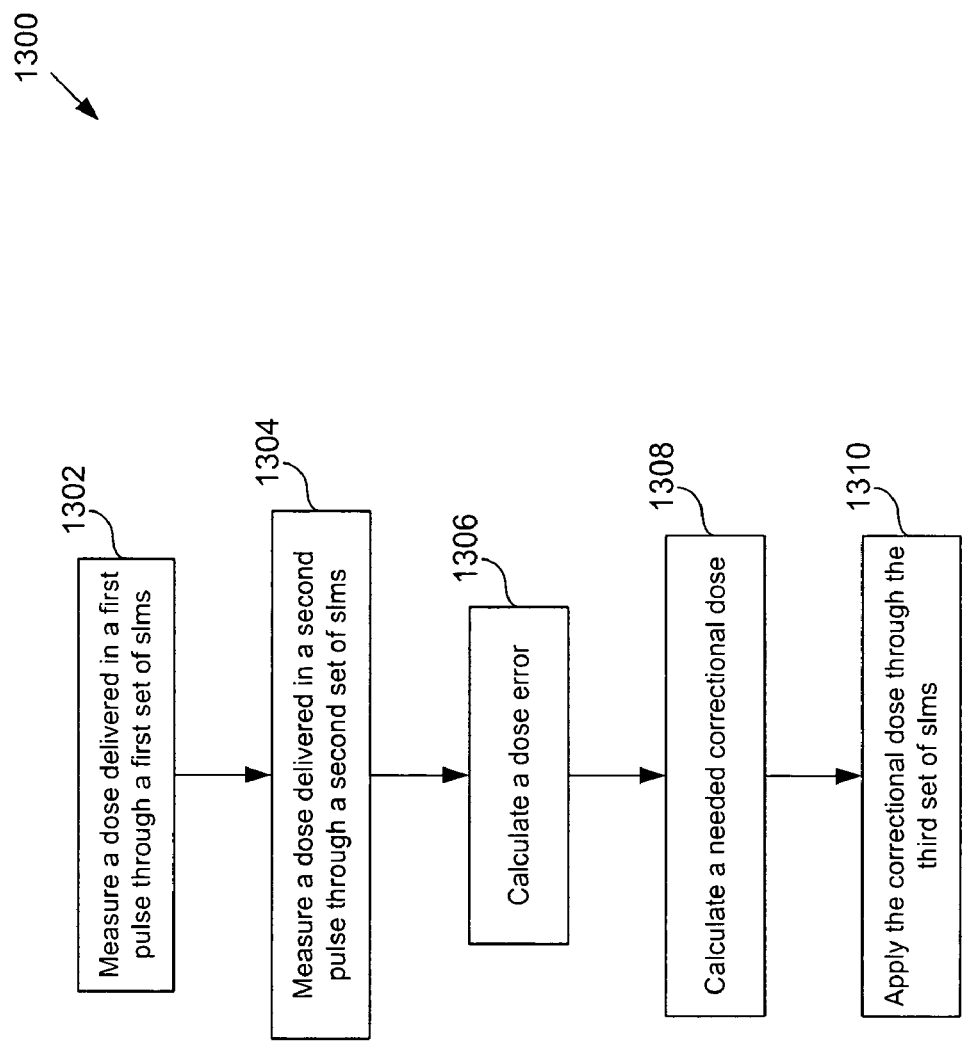

FIG. 13 is a flow chart depicting a method according to embodiments of the present invention.

Figure 14:
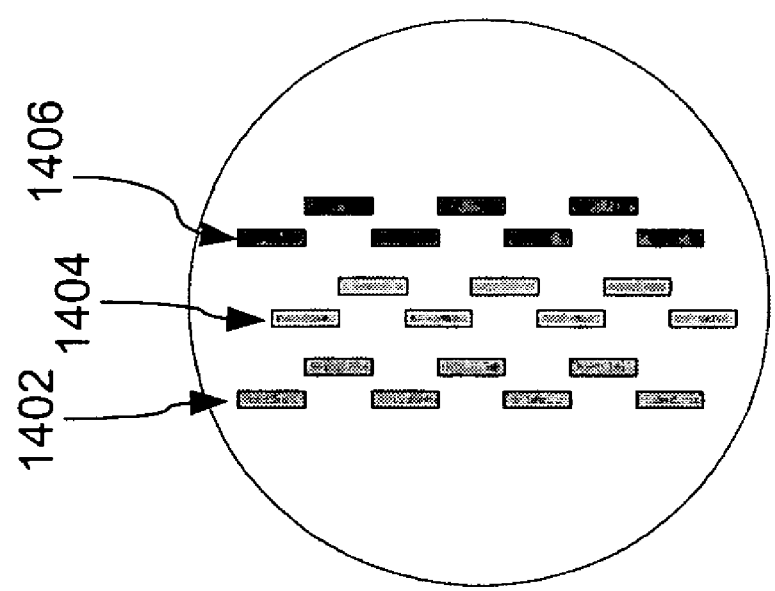
Figure 15:
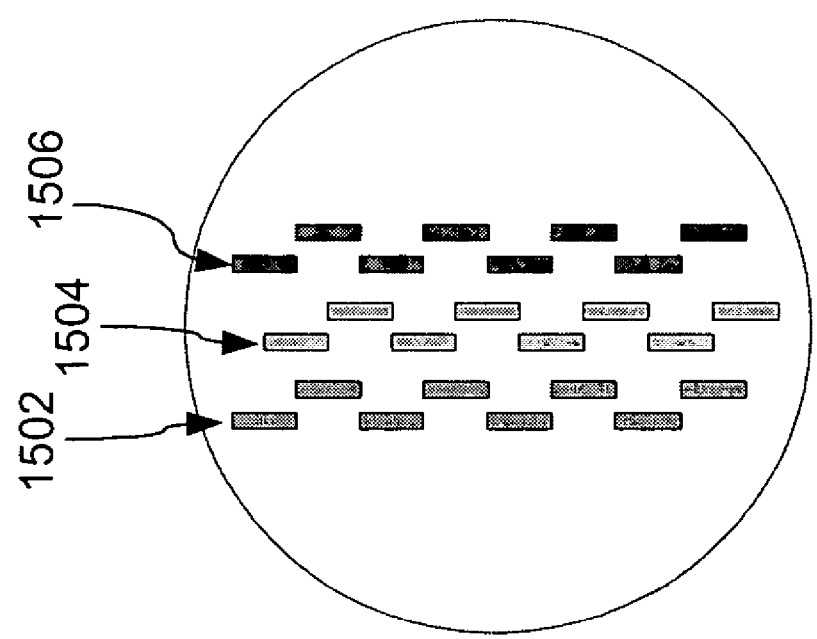

FIGS. 14 and 15 show two-dimensional arrays of spatial light modulators according to various embodiments of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

An embodiment of the present invention utilizes an array of SLMs in a maskless lithography system in order to allow for multiple exposures to the same area on an object surface during each scanning pass. Using the array of SLMs can increase throughput and lower costs compared to conventional maskless systems using only one SLM.

By integrating multiple SLMs into one mechanical assembly, a field replaceable unit can be made. This unit could integrate mechanical and thermal stability, cooling channels, purge gas channels, and electrical connections. Drive electronics, including wiring, memory, and processors, could also be integrated into assembly 500, either on a backside or in the empty space on a front side of assembly 500.

Maskless Lithography Systems

Figure 1:
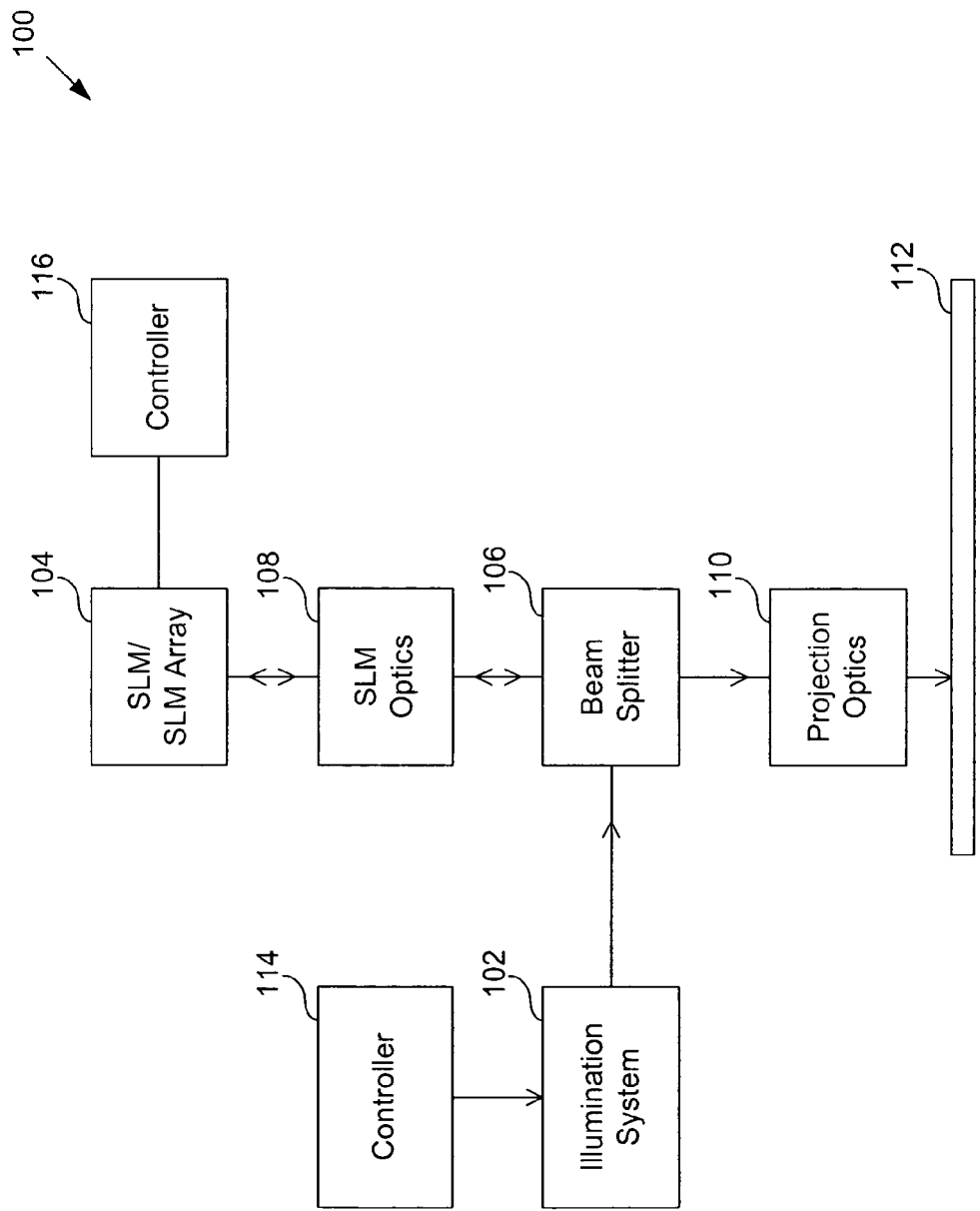
FIG. 1 shows a maskless lithography system having reflective spatial light modulators according to embodiments of the present invention

FIG. 1 shows a maskless lithography system 100 according to an embodiment of the present invention. System 100 includes an illumination system 102 that transmits light to a reflective spatial light modulator 104 (e.g., a digital micromirror device (DMD), a reflective liquid crystal display (LCD), or the like) via a beam splitter 106 and SLM optics 108. SLM 104 is used to pattern the light in place of a reticle in traditional lithography systems. Patterned light reflected from SLM 104 is passed through beam splitter 106 and projection optics 110 and written on an object 112 (e.g., a substrate, a semiconductor wafer, a glass substrate for a flat panel display, or the like).

It is to be appreciated that illumination optics can be housed within illumination system 102, as is known in the relevant art. It is also to be appreciated that SLM optics 108 and projection optics 110 can include any combination of optical elements required to direct light onto desired areas of SLM 104 and/or object 112, as is known in the relevant art.

In alternative embodiments, either one or both of illumination system 102 and SLM 104 can be coupled to or have integral controllers 114 and 116, respectively. Controller 114 can be used to adjust illumination source 102 based on feedback from system 100 or to perform calibration. Controller 116 can also be used for adjustment and/or calibration. Alternatively, controller 116 can be used for turning ON and OFF active devices (e.g., pixels, mirrors, locations, etc.) 302 (see FIG. 3) on SLM 104, as was described above, to generate a pattern used to expose object 112. Controller 116 can either have integral storage or be coupled to a storage element (not shown) with predetermined information and/or algorithms used to generate the pattern or patterns.

Figure 2:
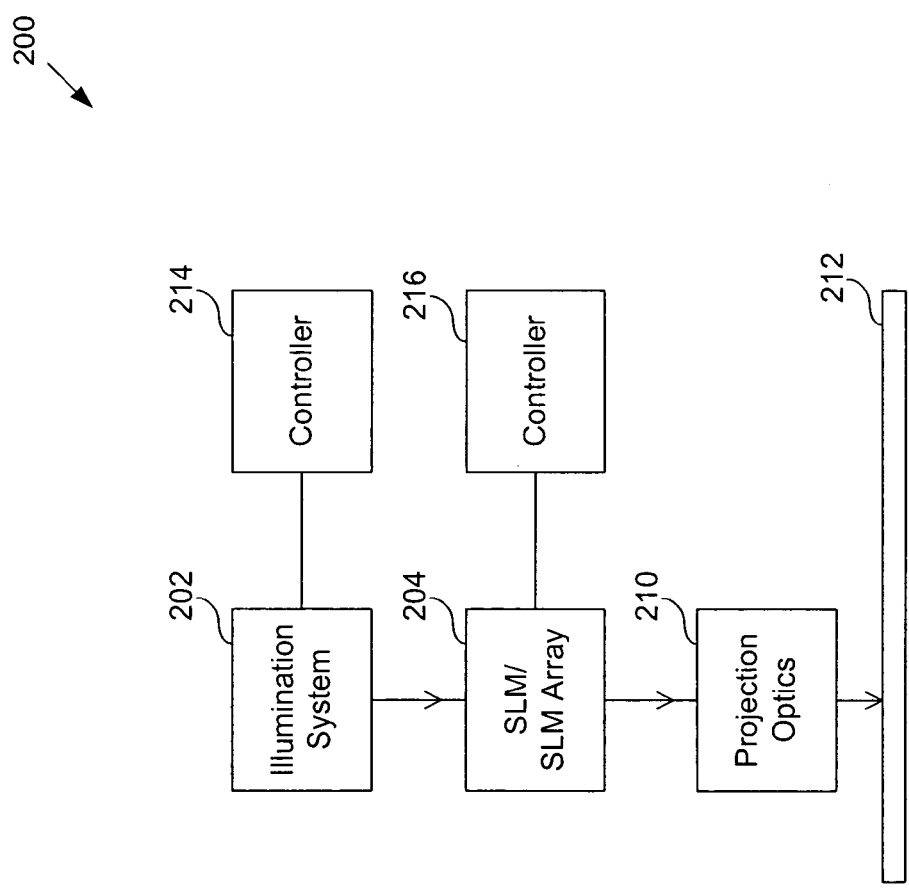
FIG. 2 shows a maskless lithography system having transmission spatial light modulators according to embodiments of the present invention.

FIG. 2 shows a maskless lithography system 200 according to a further embodiment of the present invention. System 200 includes an illumination source 202 that transmits light through a SLM 204 (e.g., a transmissive LCD, or the like) to pattern the light. The patterned light is transmitted through projection optics 210 to write the pattern on a surface of an object 212. In this embodiment, SLM 204 is a transmissive SLM, such as a liquid crystal display, or the like. Similar to above, either one or both of illumination source 202 and SLM 204 can be coupled to or integral with controllers 214 and 216, respectively. Controllers 214 and 216 can perform similar functions as controller 114 and 116 described above, and as known in the art.

Example SLMs that can be used in systems 100 or 200 are manufactured by Micronic Laser Systems AB of Sweden and Fraunhofer Institute for Circuits and Systems of Germany.

Merely for convenience, reference will be made only to system 100 below. However, all concepts discussed below can also apply to system 200, as would be known to someone skilled in the relevant arts.

Figure 3:
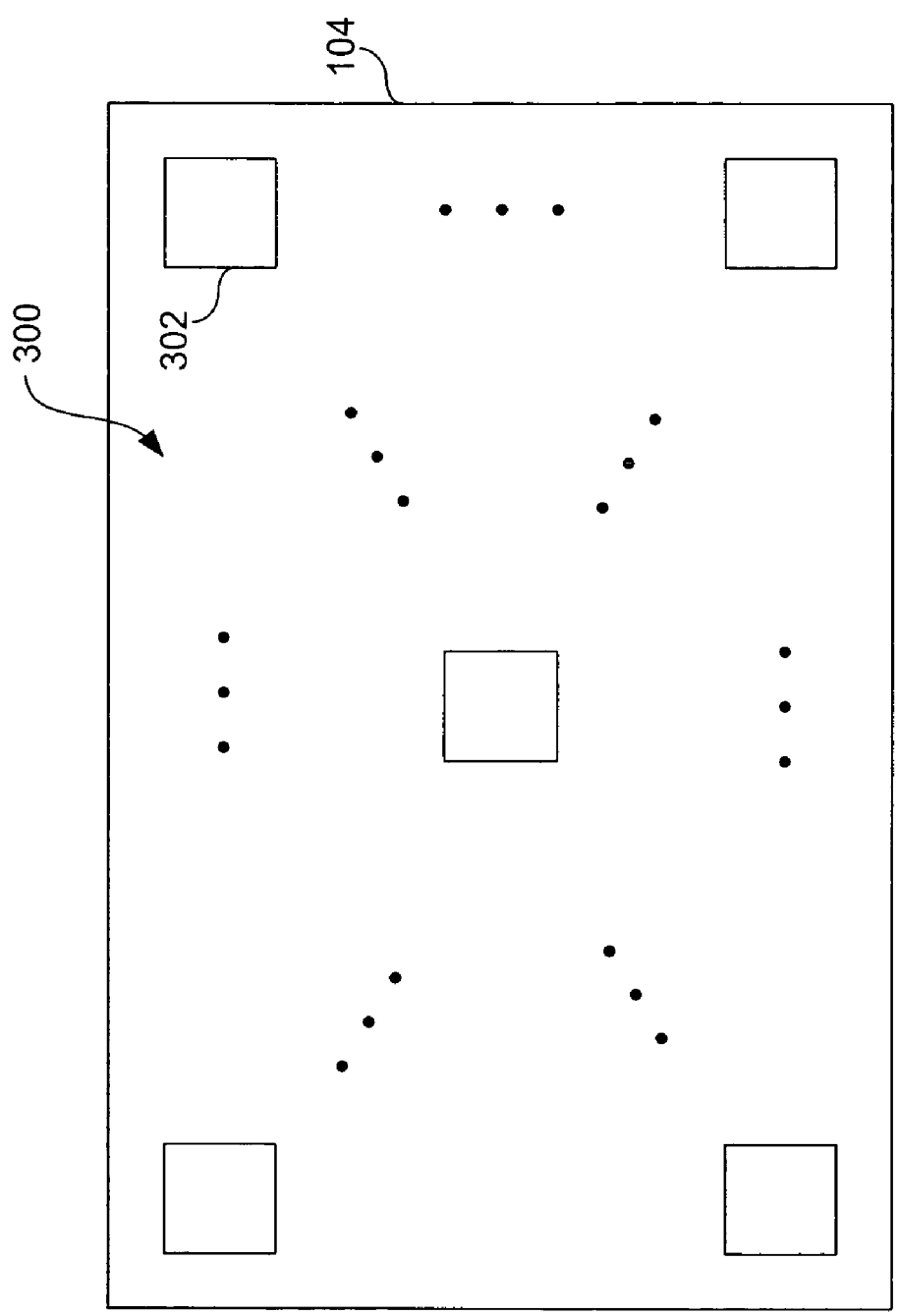
FIG. 3 shows a spatial light modulator according to an embodiment of the present invention.

FIG. 3 shows details of an active area 300 of SLM 104. Active area 300 includes an array of active devices 302 (represented by dotted patterns in the figure). Active devices 302 can be mirrors on a DMD or locations on a LCD. It is to be appreciated that active devices 302 can also be referred to as pixels, as is known in the relevant art. By adjusting the physical characteristics of active devices 302, they can be seen as being either ON or OFF. Digital or analog input signals based on a desired pattern are used to turn ON and OFF various active devices 302. In some embodiments, an actual pattern being written to object 112 can be detected and a determination can be made whether the pattern is outside an acceptable tolerance. If so, controller 116 can be used to generate analog or digital control signals in real time to fine-tune (e.g., calibrate, adjust, etc.) the pattern being generated by SLM 104.

Figure 4:
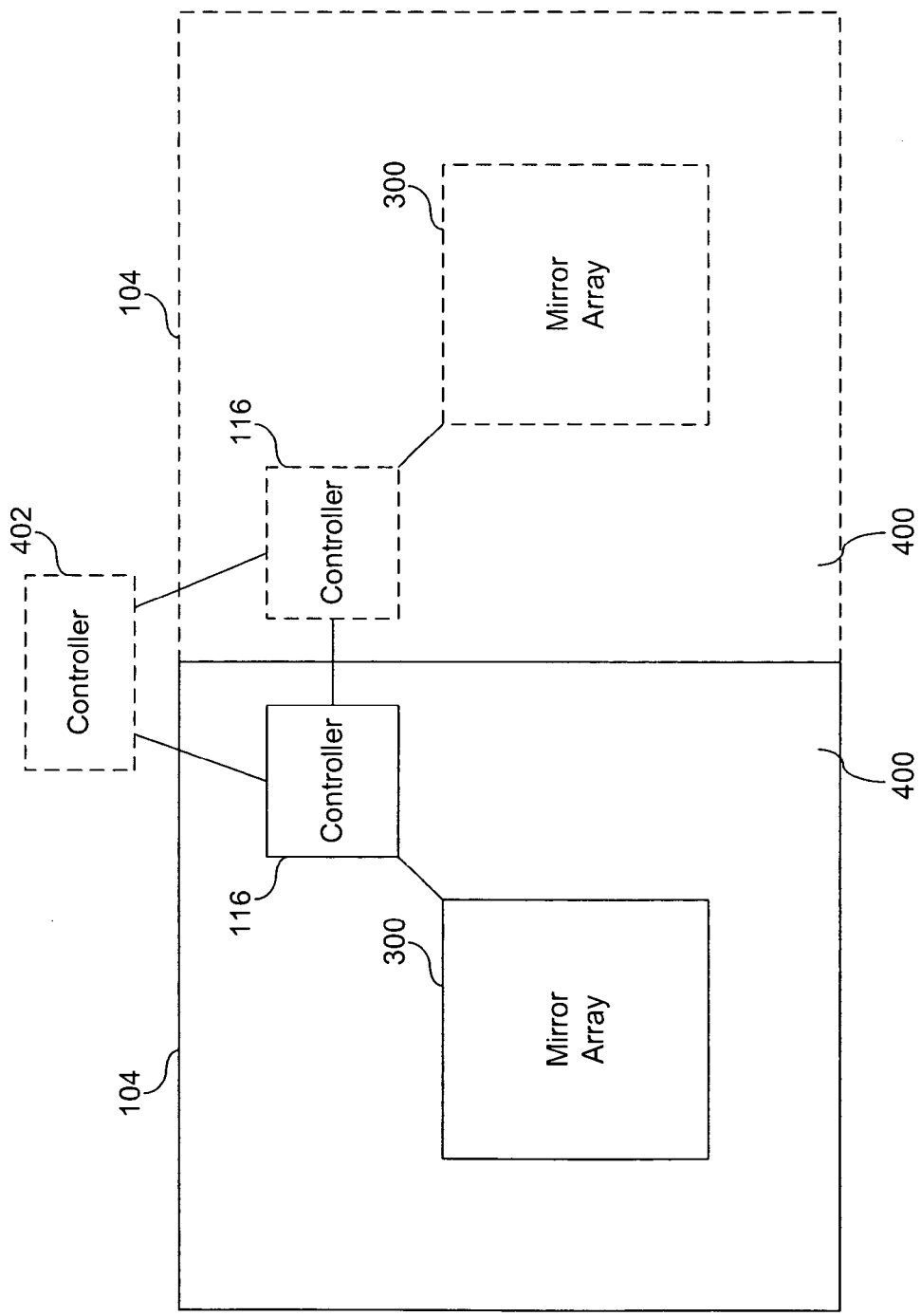
FIG. 4 shows more details of the spatial light modulator in FIG. 3.

FIG. 4 shows further details of SLM 104. SLM 104 can include an inactive packaging 400 surrounding active area 300. Also, in alternative embodiments, a main controller 402 can be coupled to each SLM controller 116 to monitor and control an array of SLMs (see discussion below). As discussed below, adjacent SLMs may be offset or staggered with respect to each other in other embodiments.

Spatial Light Modulator Array Configurations

Figure 5:
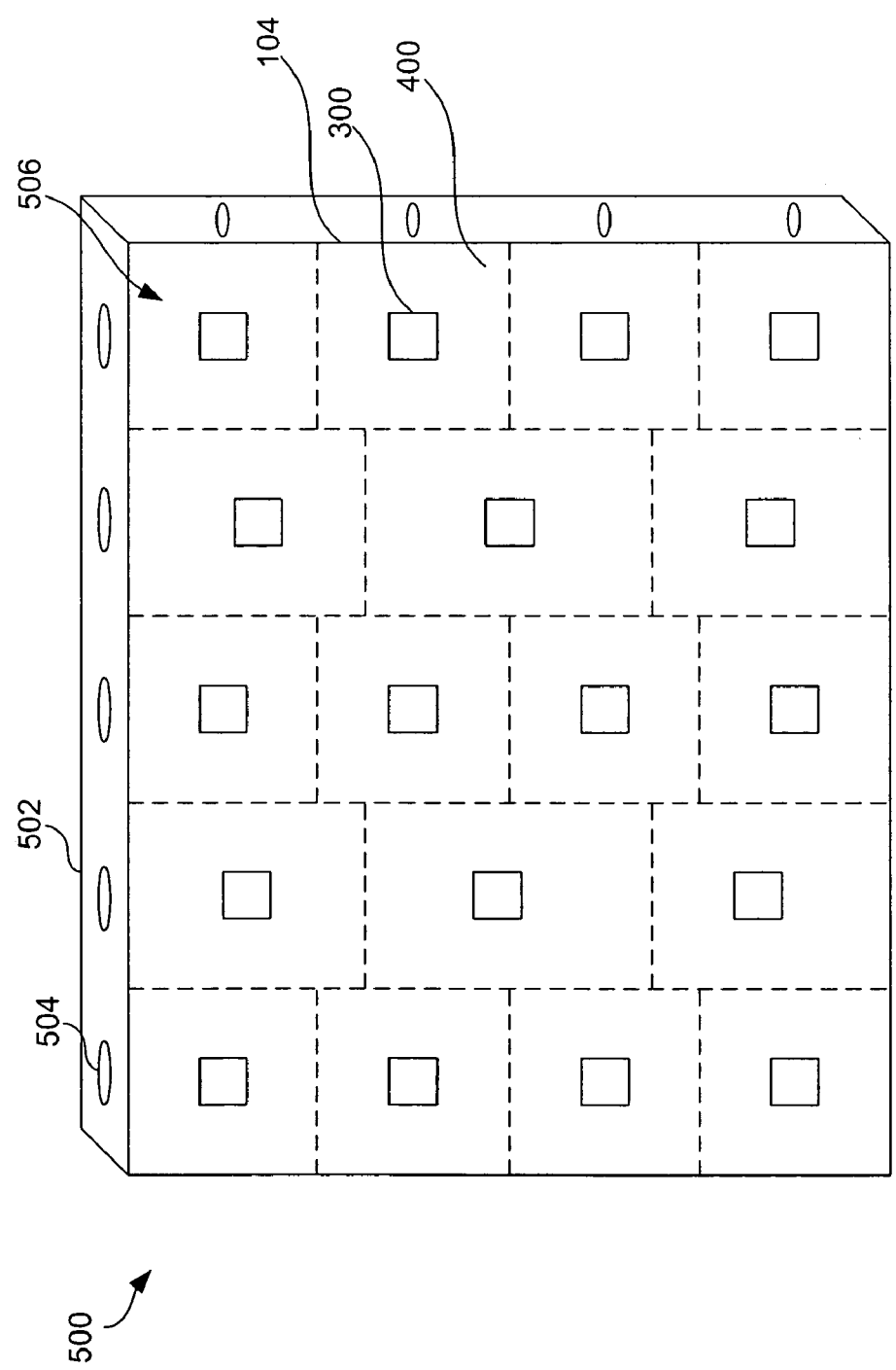

FIG. 5 shows an assembly 500 including a support device 502 that receives an array of SLMs 104. In various embodiments, as described in more detail below, the array of SLMs 104 can have varying numbers of columns, rows, SLMs per column, SLMs per row, etc., based on a number of desired exposures per pulse, or other criteria of a user. The SLMs 104 can be coupled to a support device 502. Support device 502 can have thermal control areas 504 (e.g., water or air channels, etc.), areas for control logic and related circuitry (e.g., see FIG. 4 showing elements 116 and element 402, which can be ASICs, A/D converters, D/A converters, fiber optics for streaming data, etc.), and windows 506 (formed within the dashed shapes) that receive SLMs 104, as is known in the relevant art. Support device 502, SLMs 104, and all peripheral cooling or control devices are referred to as an assembly. Assembly 500 can allow for a desired step size to produce the desired stitching (e.g., connecting of adjacent elements of features on object 112) and overlap for leading and trailing SLMs 104. By way of example, support device 502 can be 250 mm×250 mm (12 in×12 in) or 300 mm×300 mm (10 in×10 in). Support device 502 can be used for thermal management based on being manufactured from a temperature stable material.

Support device 502 can be utilized as a mechanical backbone to ensure spacing control of SLMs 104 and for embedding the circuitry and the thermal controls areas 504. Any electronics can be mounted on either or both of a backside and front side of support device 502. For example, when using analog based SLMs or electronics, wires can be coupled from control or coupling systems 504 to active areas 300. Based on being mounted on support device 502, these wires can be relatively shorter, which reduces attenuation of analog signals compared to a case where the circuitry is remote from the support device 502. Also, having short links between the circuitry and active areas 300 can increase communication speed, and thus increase pattern readjustment speed in real time.

In some embodiments, when SLM 104 or electrical devices in the circuitry wear out, assembly 500 can easily be replaced. Although it would appear replacing assembly 500 is more costly than just a chip on assembly 500, it is in fact easier and quicker to replace the entire assembly 500, which can save production costs. Also, assembly 500 can be refurbished, allowing for a reduction in replacement parts if end users are willing to use refurbished assemblies 500. Once assembly 500 is replaced, only verification of the an overall alignment is needed before resuming fabrication. In some examples, kinematic mounting techniques can be used to allow for repeatable mechanical alignments of assembly 500 during field replacements. This may eliminate a need for any optical adjustment of assembly 500.

FIGS. 6, 7, 8, 9, and 10 show how one exposure area of object 112 is patterned by a section of an SLM array. Thus, the figures show how the section of the SLM array will look from the perspective of the one exposure area of object 112.

Figure 6:
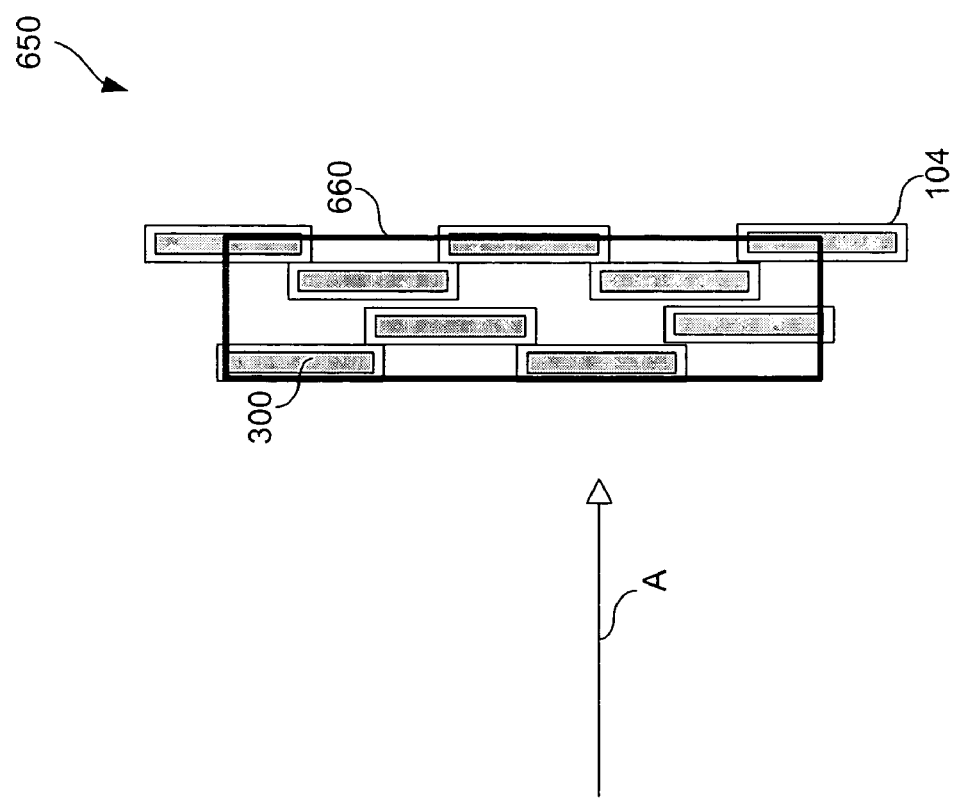
Figure 7:
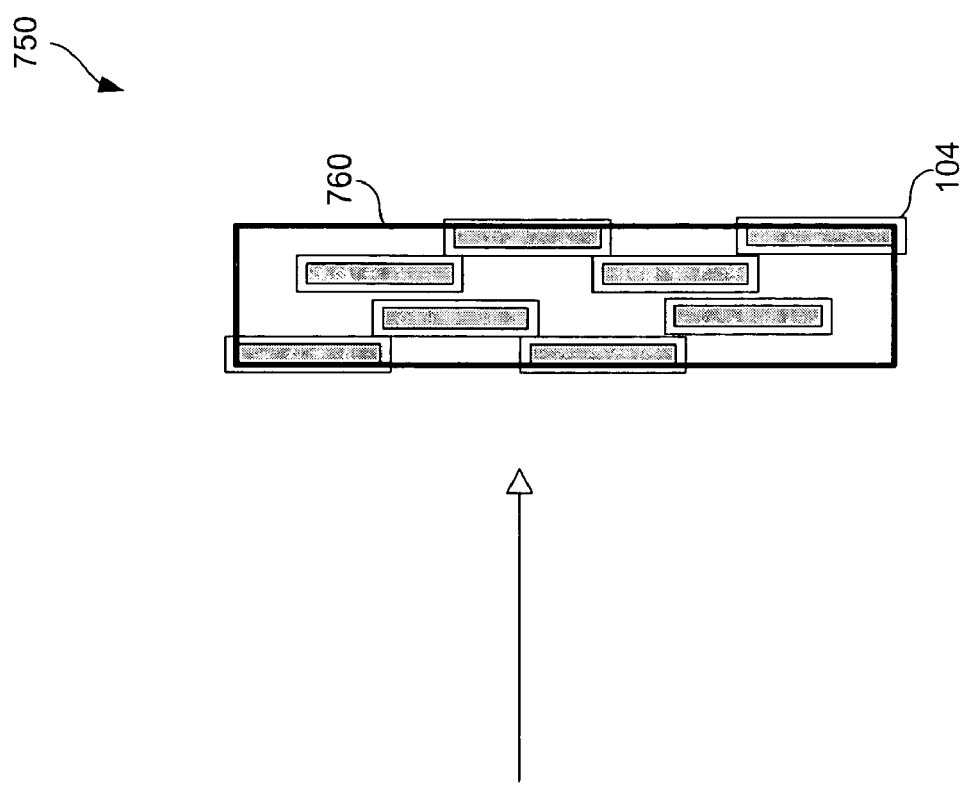

FIGS. 6 and 7 show alternative embodiments for how sections 650 and 750 of an array of SLMs 104 will fall within exposure areas 660 and 760, respectively. Sections 650 and 750 both include four columns having two equivalent SLMs 104 each. Thus, sections 650 and 750 include eight equivalent SLMs 104. SLMs 104 in one column can be staggered with respect to SLMs 104 in adjacent columns. Each column is spaced a width of one-half an active area 300 apart.

In one example, active area 300 can be 4.8 mm×30 mm and each active device 302 can be about 6 µm×6 µm. This can produce about 150× magnification. In this example, if an entire SLM 104 is about 4 megapixels (e.g., 4096 active devices 302×1024 active devices 302), each section 650 or 750 can be about 797 µm×240 µm and each exposure area 660 or 760 can be about 120 mm×36 mm.

In this example, there is about a 4.8 nm step size between light pulses at a SLM plane and about a 34 µm step between exposure periods at an object plane. Object 112 can be moving at approximately 128 mm/sec in a direction of arrow A. A data refresh rate and/or pulse rate of illumination source can be around 4 kHz. With these parameters, an expected throughput of up to about 5 wafers per hour (wph) can be possible. Thus, if an object's speed was about one active area width traveled per light pulse, each exposure area 660 and 760 would receive two pulses of light during each scan period of object 112.

Figure 8:
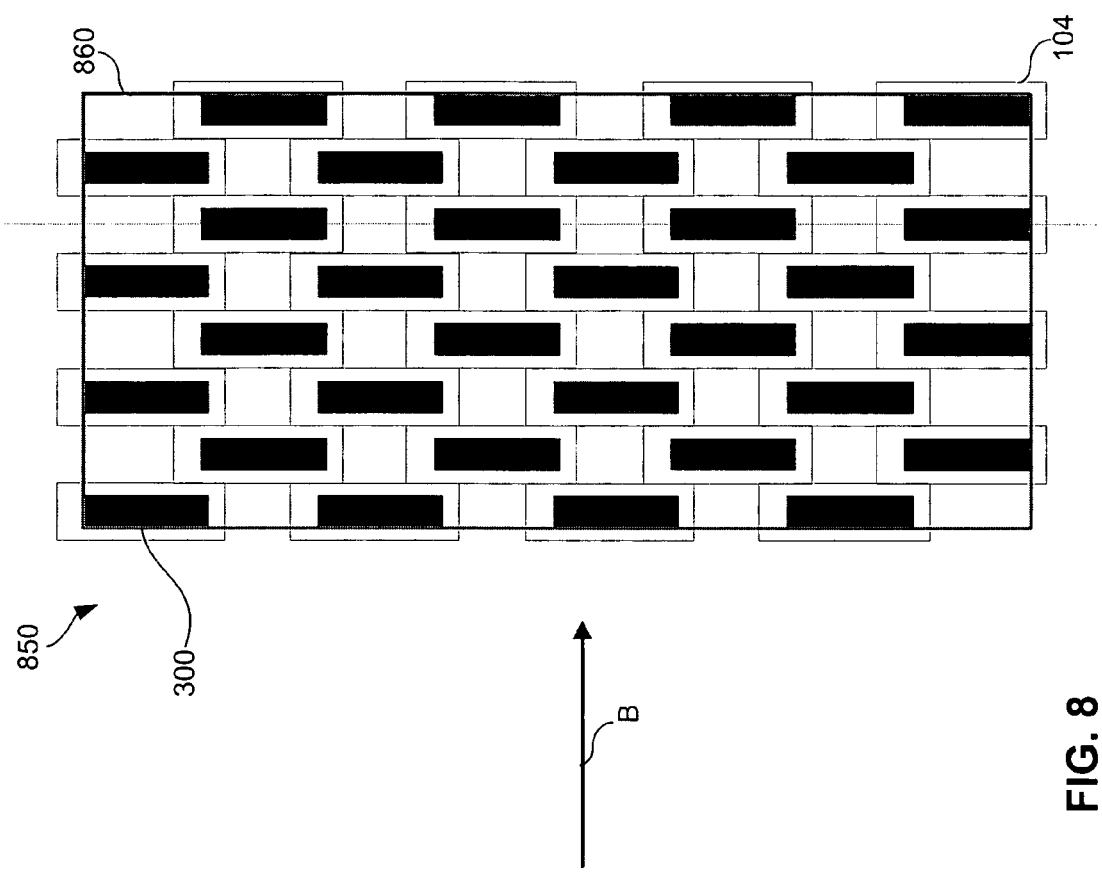

FIG. 8 shows another embodiment of an array of SLMs 104 having a section 850 writing to exposure an area 860. Section 850 includes eight columns having four SLMs 104 each. Thus, section 850 includes 32 SLMs 104. SLMs 104 in one column can be staggered with respect to SLMs 104 in adjacent columns. Each column is spaced a width of one-half an active area 300 apart.

In one example, active area 300 can be about 8.192 mm×32.768 mm and each active device 302 can be about 6 µm×6 µm. This can produce about 400× magnification. In this example, if an entire SLM 104 is about 1 megapixel (e.g., 2048 active devices 302×512 active devices 302). each section 850 can be about 567.5 µm×344 µm and each exposure area 860 can be about 227 mm×137.2 mm.

In this example, there is about a 16.4 mm step size between light pulses at a SLM plane and about a 43.52 µm step between exposure periods at an object plane. Object 112 can be moving at approximately 40.96 mm/sec in a direction of arrow B. A data refresh rate and/or pulse rate of illumination source can be around 1 kHz. With these parameters, an expected throughput of up to about 1.2 wph can be possible. Thus, if an object's speed was about two active area widths traveled per light pulse, each exposure area 860 would receive two pulses of light during each scan period of object 112. In an alternative example, if an object's speed was about one active area width traveled per light pulse, each exposure area 860 would receive four pulses of light during each scan period of object 112.

Figure 9:
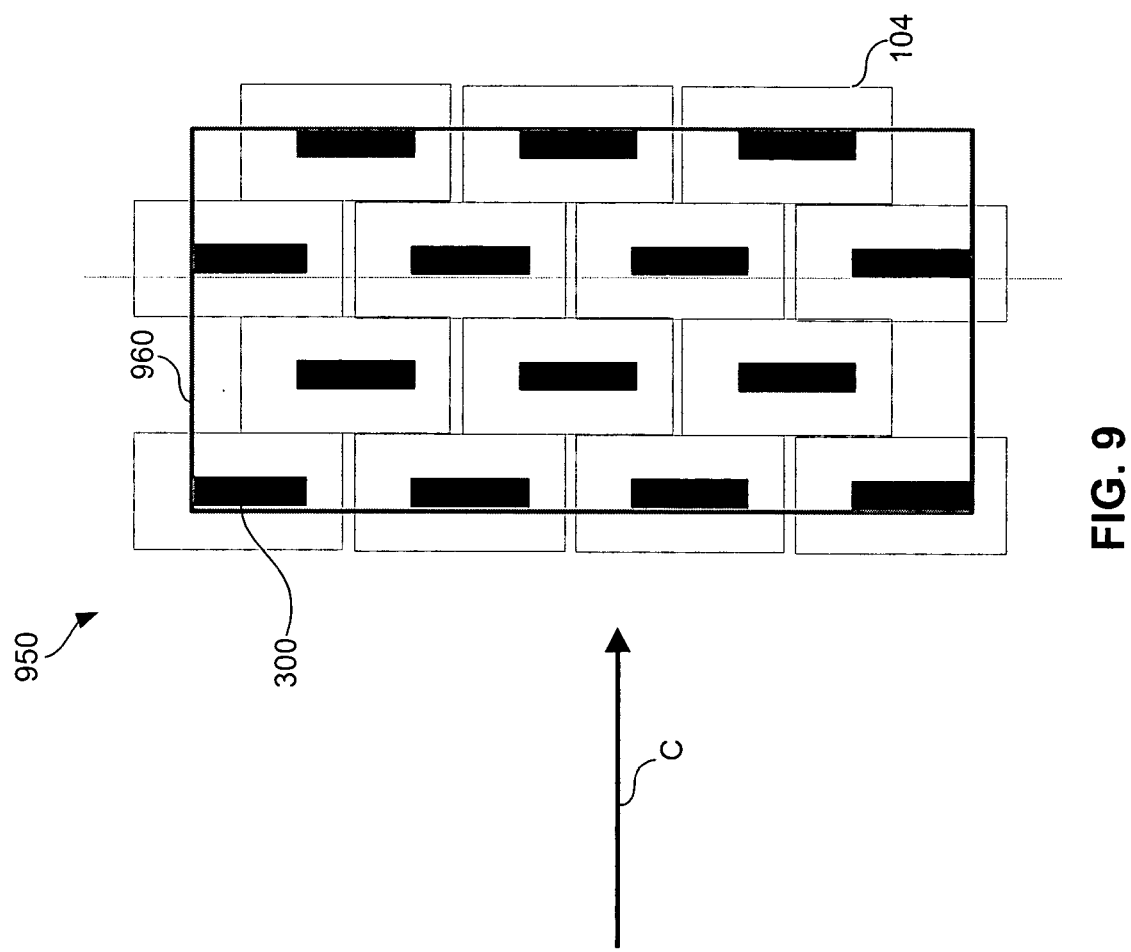

FIG. 9 shows another embodiment of an array of SLMs 104 having a section 950 writing to an exposure area 960. Section 950 includes six columns alternating between having three or four SLMs 104. Thus, section 950 includes 14 SLMs 104. SLMs 104 in one column can be staggered with respect to SLMs 104 in adjacent columns. Each column is spaced one width of one active area apart.

In one example, active area 300 can be about 8.192 mm×32.768 mm and each active device 302 can be about 6 µm×6 µm. This can produce about 400× magnification. In this example, if an entire SLM 104 is about 1 megapixel (e.g., 2048 active devices 302×512 active devices), each section 950 can be about 567.5 µm×344 µm and each exposure area 960 can be about 227 mm×137.2 mm.

In this example, there is about a 8.2 mm step size between light pulses at a SLM plane and about a 21.76 µm step between exposure periods at an object plane. Object 112 can be moving at approximately 1 Khz or 20.48 mm/sec in a direction of arrow C. With these parameters, an expected throughput of up to about 0.6 wph can be possible. Thus, if an object's speed was about one active area width traveled per light pulse, each exposure area 960 can receive two pulses of light during each can period of object 112.

Figure 10:
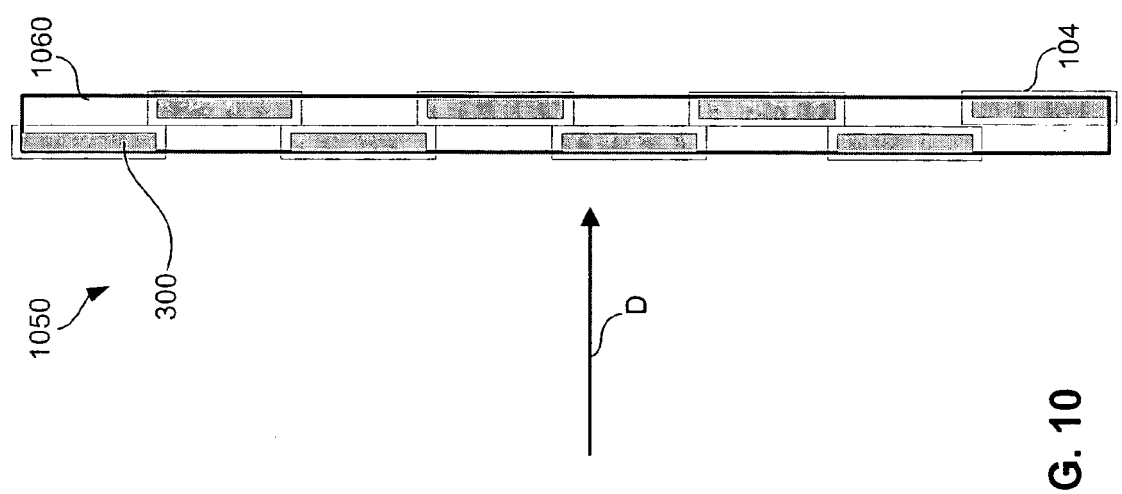

FIG. 10 shows another embodiment of an array of SLMs 104 having a section 1050 writing to an exposure area 1060. Section 1050 can include two columns having four SLMs 104 each. Thus, section 1050 includes 8 SLMs 104. SLMs 104 in one column can be staggered with respect to SLMs 104 in adjacent columns. Each column is spaced one-half an active area width apart.

In one example, active area 300 can be about 4.5 mm×36 mm and each active device 302 can be about 6 µm×6 µm. This can produce about 150× magnification. In this example, if an entire SLM 104 is about 4 megapixels (e.g., 6000 active devices 302×750 active devices 302), each section 1050 can be about 1593 µm×96 µm and each exposure area 1060 can be about 239 mm×14 mm.

In this example, there is about a 4.5 mm step size between light pulses at a SLM plane and about a 31.5 µm step between exposure periods at an object plane. Object 112 can be moving at approximately 64 mm/sec in a direction of arrow D. A data refresh rate and/or pulse rate of illumination source can be around 4 kHz. With these parameters, an expected throughput of up to about 5.1 wph can be possible. Thus, if an object's speed was about one-half active area width traveled per light pulse, each exposure area 1060 could receive two pulses or light during each scan period of an object 112.

Exposure Diagrams for Arrays of Spatial Light Modulators

FIG. 11 is one example of an exposure diagram for three sections 1150 of an array having four SLMs 104 per section as they write to a same row of exposure areas 1160 on object 112 during five pulses of light. Sections 1150-1 and 1150-3 can be part of a first (e.g., leading) set of SLMs and Section 1150-2 can be part of a second (e.g., trailing) set of SLMs. This exposure diagram is shown from the perspective of object 112 as it is moving in the direction of the arrow with an equivalent step of two widths of active areas 300 per light pulse. During Pulse 1, the array has not overlapped object 112. During Pulse 2, a pattern generated by the array for SLMs 104 in a first section 1150-1 is written to a first exposure area 1160-1. During Pulse 3, either the same or a different pattern is written to exposure area 1160-1 by section 1150-2 and either the same or different pattern is written to exposure area 1160-2 by section 1150-1. Thus, the trailing set in section 1150-2 writes over a same exposure area 1160-1 later in time as the leading set in section 1150-1. This general exposure process is repeated for Pulses 4 and 5, as is shown.

It is to be appreciated this is a very simple example of the exposure process that can occur using an array of SLMs 104 in a maskless lithography system. It is being used to demonstrate how using an array of SLMs 104 allows for multiple exposures in each exposure area 1160 during each scan period, which increases throughput compared to a conventional system using one SLM.

Operation

In this example, light is scanned across object 112, while each SLM 104 receives updated pattern data. This results in multiple pulses reflecting from multiple SLMs 104 as scanning occurs. In each direction, a first set (e.g., a leading set) of SLMs 104 directs a first pulse and second set (e.g., a trailing set) of SLMs 104 comes up behind the first set and directs the second pulse (e.g., trailing SLMs). Hence, at any instance in time a single pulse is directed by varying pattern profiles on SLMs 104 to write varying patterns to object 112.

For example, during the duration between pulses, object 112 is stepped either all or a portion of a width of active area 300. Then, 3–4 pulses later, a trailing SLM 104 can overlap something printed 3-4 pulses ago by a leading SLM 104. System 100 can continuously or periodically update the pattern, accordingly. This allows for printing during multiple passes with SLMs 104, while keeping object 112 continuously moving and only doing one pass over object 112 to achieve higher throughput compared to conventional systems using only one SLM.

In essence, system 100 allows for exposing multiple patterns during one pass by using multiple SLMs 104. There could be full overlap, half overlap, etc. of patterns generated by leading and trailing SLMs 104 in order to allow for stitching or other effects.

Some features of the various embodiments of the present invention described above may be that it allows for: process flexibility in terms of number of pulses to deliver each dose, while maintaining a continuously moving wafer, easy algorithm development for pattern rasterization by pre-defining the geometric relationship between leading and trailing SLMs, dead pixels on one SLM to be compensated for by corresponding pixels on other SLMs, and a mechanism by which an array of multiple SLMs can be field-replaceable on a single mechanical unit with only minor electrical, mechanical, pneumatic, and cooling connections and a quick optical adjustment.

The geometrical layout of assembly 500 (e.g., the spaces between SLMs 104) can be a function of: active area 300 on each SLM 104, the area taken up by packaging 400 for each SLM 104, the number of pulses desired to deliver a particular dose to a particular exposure area, the maximum object stage speeds achievable, and the maximum lens diameter in projection optics 110.

In one example, an amount of exposures for each exposure area can be increased by a factor of two (i.e. 2, 4, 8, 16, etc.) using the same SLM array layouts by just halving the object stage scan speed. Scan speed should remain constant, and is defined by the geometrical relationship between SLMs 104. The amount of overlap between leading and trailing SLMs 104 depends on the overall stitching strategy employed. Different examples of this include full overlap, half overlap, or shifted overlap (e.g., full or half overlap where the pixels on trailing SLMs 104 are offset by a fraction of a pixel in X and Y as compared to leading SLMs 104). The spacing between leading and trailing SLMs can be on the order of the smallest possible multiple of (active_area_width)/(#_of_exposures), plus the stitching overlap, compatible with the physical packaging of the SLM.

Dose and Uniformity Control System and Method Using Monitoring

FIG. 12 is a system 1200 that can control dose and/or uniformity for a multiple SLM pattern generation array, according to an embodiment of the present invention. The control of SLMs 104 can be based upon measurements 1202 of an intensity using controller 1204 (e.g., a dose/uniformity manipulator for leading pattern generation SLMs (high transmission measured)). Controller 1204 measures leading SLMs 104 at the point in time that the leading SLMs 104 are exposed. This measurement is subtracted from a predetermined value 1206 (e.g., setpoint/dose uniformity value in leading SLMs) using subtractor 1208 to generate an error signal 1210 (e.g., dose/uniformity error in leading SLMs 104. Error signal 1210 can be delayed using delay device 1212 that receives a delay signal 1214. Delay signal 1214 can be based on the number of pulses between leading and trailing pulses of the SLM array. The delayed signal 1212 is added to a predetermined value 1216 (e.g., a setpoint dose/uniformity value in the trailing SLMs) using adder 1218 to generate a control signal 1220. Controller 1222 receives control signal 1220, which can be a dose/uniformity manipulator for the trailing pattern generation SLMs 104. Controller 1222 may be low transmission controllable.

If the controlled SLM 104 has sufficient zones, it can also be used to vary intensity along the height of the exposure for the trailing SLM 104 to compensate for non-uniformities in the beam during the leading pulse. To accommodate stitching, which may cause two "first pulses" to be overlapped with one "second pulse," the trailing portion can be further subdivided into bands that are commanded with the appropriate correction. The shot energy in the trailing SLMs 104 can be selected so as to accomplish stitching.

In order to successfully compensate for dose variations during the leading pulse without worrying about induced errors from trailing pulses, the energy in the leading pulse can be significantly higher than the trailing pulses. As an example for a two-pulse system, a ratio of 90% dose for leading SLMs 104, 10% dose for trailing SLMs 104 could be envisioned, meaning that the error in dose on the trailing SLMs 104 would be 9× lower than the error in dose on the leading SLM 104. Continuing the example, if the dose on a given set of leading SLMs 104 was measured at 85% instead of the 90% nominal, the attenuation of the trailing SLMs 104 during the appropriate pulse could be set to allow 15% dose transmission, instead of the nominal 10% dose.

The SLM 104 can be constructed to cover both sides of the beam. This would allow for reversal in exposure scan direction (which reverses the leading and trailing SLMs 104) as well as to provide the capability for correcting offsets in transmission and uniformity for the leading SLMs 104.

It is to be appreciated that this concept is readily extendable to a single SLM system or any functional multi-SLM array, and can be used in any lithographic printing strategy with two or more pulses per point on the wafer being applied to deliver dose. One advantage for this embodiments is that it can improve dose control in a direct-write lithographic system use of conventional lithographic lasers, which have relatively poor pulse-to-pulse energy intensity variability and uniformity performance.

Dose Control System and Method Using A Correctional Blanket Dose

In maskless lithography only a very limited number of laser pulses are used to expose the resist. This is to maintain a reasonable throughput in a maskless lithography tool. For example, a number of laser flashes exposing the resist can be limited to 2 to 4 at each site on the wafer. The dose repeatability of the commonly used excimer laser is typically in the 1 to 3% 1σ, while the required exposure dose needs to be within 0.5% 3σ. Without monitoring this would result in an unacceptable dose variations.

Embodiments of the present invention can use 3 or 4 laser flashes (exposures) in which the last pulse only contains a small (e.g., 5%) fraction of the total dose needed to expose the resist. Although an example system and method are found in WO 99/45435, embodiments of the present invention can have several advantages over this system, such as substantially no throughput loss and very limited increase in the cost of goods manufactured.

Embodiments of the present invention divide the dose over the laser flashes, such that the last flash only delivers a small fraction, say 5%, of the total dose. Measuring the first two or three doses then defines the dose in the last pulse.

In one example, the last exposure can have the full patterning information. In this case, the data path needs to be fully loaded to generate that information. Moreover, if the exposures are delivered sequentially, as has been done in conventional systems, the last exposure decreases the throughput of the tool considerably. In another example, the last exposure can have substantially no patterning information, as is described below.

Accordingly, embodiments on the present invention provide a final exposure to correct for dose errors in the previous exposures. The final exposure will be delivered as a blanket exposure. This means that the final exposure does not contain any pattern information. The final exposure thus does not need an extensive (and thus expensive) data path.

FIG. 13 is a flow chart depicting a method 1300 according to embodiments of the present invention. In step 1302, a first set of SLMs measures a dose delivered in the first pulse. In step 1304, a second set of SLMs measures a dose delivered in a second pulse. In step 1306, a dose error is calculated. In step 1308, a correctional blanket dose is calculated. In step 1310, the correctional blanket dose is applied through a final set of SLMs.

FIG. 14 shows a layout of SLMs having 21 SLMs. The SLMs generate three shots 1402, 1404, and 1406 at three different exposure times. In this configuration, a lens (not shown) in a projection optical system can have a diameter of about 271 mm.

FIG. 15 shows a layout of SLMs having 24 SLMs. The SLMs generate three shots 1502, 1504, and 1506 at three different exposure times. In this configuration, a lens (not shown) in a projection optical system can have a diameter of about 302 mm.

In the proposed layout for FIGS. 14 and 15, all three exposures (1402–1406 or 1502–1506) are done within a single exposure field. At each position on the wafer the dose is delivered sequentially. For example, in FIG. 15 if pulse N delivers the first dose then pulse N+3, N+4, N+5, or N+6 delivers the second dose, depending on the precise layout of the SLM array. This means that a single SLM-sized field will experience four potentially different doses. The SLM in the 3rd shot (column) 1406/1506 should then be delivering four different correctional doses. Exposures 1402/1502 and 1404/1504 both hold complete data information. This means that SLM columns 1402/1502 and 1404/1504 are connected to an extensive data path.

The data path is one of the most expensive components of the maskless lithography tool. In conventional systems, an addition of the final shot would increase the costs even more because it would add about 50% to the data path. To avoid these extra costs, embodiments of the present invention apply a blanket exposure with the final SLM column 1406/1506. This means that the final exposure will contain no pattern data. The purpose is to add an additional background in a controlled manner. The only "pattern" on the SLMs is there because it will need to correct for potentially four different doses within the SLM field. This, however is a very simple pattern that needs only a very limited amount of electronics.

Consider an aerial image f(x) and a resist threshold th. The boundary $x_{th}$ between exposed and non-exposed resist is then given by:

$$f(x_{th})=th. \tag{1}$$

Now assume that the delivered dose deviates from the ideal dose by a factor b, i.e.:

$$\text{delivered\_dose}(x)=b\,f(x). \tag{2}$$

Clearly (1) does not hold anymore. To restore the condition laid down in (1), add (1−b) th to (2) and obtain:

$$\text{dose}(x)=b\,f(x)+(1-b)th=th+b(f(x)-th). \tag{3}$$

Now dose($x_{th}$)=th produces $$th+b(f(x_{th})-th)=th, \tag{4}$$

which implies (1). Therefore the correctional background dose is given by:

$$D=(1-b)th, \tag{5}$$

which is independent of the actual pattern. This holds for every value of b. In our case however, b will be close to but less then one. As an example the dose in the first two exposures can be 96% and in the final nominally 4%. Then b will be 0.96. The dose correction method as proposed above does have a small negative effect on the exposure latitude. The exposure latitude is given by the slope of the aerial image at the resist threshold:

$$S = \frac{dy}{dx}\bigg|_{x=x_{th}} \tag{6}$$

Again assume the dose deviates from the ideal dose by a factor b then S will be given by:

$$S = b\frac{dy}{dx}\bigg|_{x=x_{th}} \tag{7}$$

So the exposure latitude will be degraded by a factor 1−b. In the example given above the degradation will be 4% (e.g. from 10% to 9.6%). Error budgeting indicates that this decrease of exposure latitude can be absorbed. However, in preferred embodiments the correctional dose is maintained as small as possible.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A maskless lithography system, comprising:
   an illumination system;
   an object;
   a thermally controllable support structure;
   analog spatial light modulators (SLMs) that pattern light from the illumination system before the light is received by the object, wherein each SLM has a plurality of elements that are positioned to produce a plurality of gray levels to be received at the object, the SLMs being supported by the thermally controllable support structure, and wherein each one of the SLMs comprises an active area section and an inactive packaging section, and
   a controller that transmits control signals to the SLMs to position the elements.

2. The system of claim 1, wherein the object is a semiconductor wafer.

3. The system of claim 1, wherein the object is a glass substrate.

4. The system of claim 3, wherein the glass substrate is part of a liquid crystal display.

5. The system of claim 1, further comprising:
   a beam splitter that directs light from the light source to the SLMs and from the SLMs to the object, wherein the SLMs are reflective SLMs.

6. The system of claim 1, wherein the SLMs are transmissive SLMs.

7. The system of claim 1, wherein the SLMs are liquid crystal displays.

8. The system of claim 1, further comprising:
   a beam splitter that directs light from the light source to the SLMs and from the SLMs to the object, wherein the SLMs are digital micromirror devices (DMDs).

9. The system of claim 1, wherein the control signal to the SLMs allows for more than one at least partial exposure of a same area of the object during a single scan.

10. The system of claim 1, wherein the SLMs are positioned a predetermined distance apart such that more than one SLM exposes an exposure area on the object for pulses occurring during continuous movement of the object based on the control signal.

11. The system of claim 1, wherein the SLMs are configured in a two-dimensional array.

12. The system of claim 1, wherein a first edge of a first one of the SLMs lies in a same plane as a second edge of an adjacent, second one of the SLMs.

13. The system of claim 1, wherein the SLMs are staggered with respect to adjacent SLMs.

14. The system of claim 1, wherein a set of the SLMs that writes to a same exposure area on the object includes four columns of the SLMs.

15. The system of claim 14, wherein the columns are positioned one-half of an active area apart.

16. The system of claim 14, wherein each of the SLMs has an active inactive area and wherein a top of the active area of one of the SLMs is aligned with a bottom of the active area of an adjacent one of the SLMs.

17. The system of claim 14, wherein each of the columns includes two of the SLMs.

18. The system of claim 14, wherein each of the columns includes four of the SLMs.

19. The system of claim 14, wherein the exposure area on the object moves a distance approximately equal to two active areas of the SLMs during each pulse of the illumination system.

20. The system of claim 1, wherein a set of the SLMs that writes to a same exposure area on the object includes six columns of the SLMs.

21. The system of claim 20, wherein a top of an active area of one of the SLMs is aligned with a bottom of an adjacent active area of another one of the SLMs.

22. The system of claim 20, wherein each of the columns includes four of the SLMs.

23. The system of claim 20, wherein the columns are positioned one-half of an active area apart.

24. The system of claim 20, wherein the columns are positioned one active area apart.

25. The system of claim 1, wherein a set of the SLMs that writes to a same exposure area on the object includes two columns of the SLMs.

26. The system of claim 25, wherein a top of an active area of one of the SLMs is aligned with a bottom of an adjacent active area of another of the SLMs.

27. The system of claim 25, wherein each of the columns includes four of the SLMs.

28. The system of claim 25, wherein the columns are positioned one-half of an active area apart.

29. The system of claim 25, wherein the exposure area on the object moves a distance approximately equal to one active area of the SLMs during each pulse of the illumination system.

30. The system of claim 1, wherein the SLMs are coupled to the thermally controllable support device in a two dimensional array.

31. The system of claim 30, wherein the thermally controllable support device comprises cooling channels running therethrough.

32. The system of claim 30, wherein the thermally controllable support device comprises a controller.

33. The system of claim 1, wherein the package section comprises:

a controller to control devices in the active area.

34. The system of claim 33, wherein the control circuitry controller receives the control signal from the controller.

35. The system of claim 1, wherein a set of the SLMs that writes to a same exposure area on the object includes six columns of the SLMs.

36. The system of claim 1, wherein a set of the SLMs that writes to a same exposure area on the object includes eight columns of the SLMs.

\* \* \* \* \*